(12) United States Patent
Lundahl

(10) Patent No.: US 9,507,992 B1
(45) Date of Patent: Nov. 29, 2016

(54) FINGERPRINT SENSING DEVICE WITH HETEROGENEOUS COATING STRUCTURE COMPRISING AN ADHESIVE

(71) Applicant: Fingerprint Cards AB, Göteborg (SE)

(72) Inventor: Karl Lundahl, Göteborg (SE)

(73) Assignee: FINGERPRINT CARDS AB, Göteborg (SE)

( * ) Notice: Subject to any disclaimer, the term of this patent is extended or adjusted under 35 U.S.C. 154(b) by 0 days.

(21) Appl. No.: 14/997,689

(22) Filed: Jan. 18, 2016

(30) Foreign Application Priority Data

Jun. 8, 2015 (SE) ...................................... 1550748

(51) Int. Cl.
*G06K 9/00* (2006.01)
*G03F 7/16* (2006.01)

(52) U.S. Cl.
CPC ................ *G06K 9/0002* (2013.01); *G03F 7/16* (2013.01); *G06K 9/00* (2013.01)

(58) Field of Classification Search
CPC ........ G06F 3/044; G06F 21/32; G06F 21/82; G06F 3/041; G06F 3/0416; G06F 3/0436; G06F 3/0412; G06F 2203/04104; G06F 3/0414; G06F 2203/04103; G06F 2203/04106; G06F 2203/04111; G06K 9/0002; G06K 9/00053; G06K 9/00006; G06K 9/00013; G06K 9/00912; G06K 9/00026; H01L 2924/3011; H01L 2924/3025; H01L 2224/48247; H01L 2924/14; H01L 2224/03; H01L 2224/05553; H01L 2924/13063; H01L 24/48; H01L 2224/80; H01L 27/14806; H01L 21/308; H01L 2224/0362; H01L 2224/05599; H01L 2224/80895; H01L 24/03; H01L 24/05; G07C 2009/00095; G07C 9/00174; Y10S 257/914; Y10S 438/931; H03K 17/962; H03K 2217/960785; G01N 33/54313; G01N 27/27; G01N 27/414; G01N 27/4145; G01S 15/02; G01S 7/52017; G07D 7/02; G07D 7/04; G07D 7/2033; H05K 1/189; H05K 2201/10151; B60C 11/243; B60C 23/0449; G01D 21/00; G01F 23/26; G01F 23/263; G01F 23/268; G01F 23/284; C12Q 1/689; C12Q 1/6874; Y10T 29/49002; G01L 19/086; H01Q 1/2208
USPC ................ 382/124, 312; 345/173, 174, 207; 235/493, 449; 257/341, 342, 350, 233, 257/226, 207
See application file for complete search history.

(56) References Cited

U.S. PATENT DOCUMENTS 6,330,145 B1 * 12/2001 Lepert ................ G06K 9/00053
361/220
8,717,775 B1 * 5/2014 Bologna ................ H01L 23/00
361/761

(Continued)

*Primary Examiner* — Vu Le
*Assistant Examiner* — Aklilu Woldemariam
(74) *Attorney, Agent, or Firm* — Remarck Law Group PLC

(57) ABSTRACT

A fingerprint sensing device comprises a sensing chip comprising an array of capacitive sensing elements. The sensing device comprises a coating material arranged in a layer on top of the array of sensing elements, the coating material comprising a plurality of cavities filled with an adhesive; wherein locations of the cavities correspond to locations of the sensing elements, such that a cross-section area of a cavity covers at least a portion of an area of a corresponding sensing element; and wherein a dielectric constant of the adhesive is higher than a dielectric constant of the coating material; and a protective plate attached to the sensing chip by means of the adhesive. Another sensing device is disclosed, where the coating layer comprises trenches filled with an adhesive, and where the coating has a higher dielectric constant than the adhesive. Associated methods of manufacturing are also disclosed.

28 Claims, 8 Drawing Sheets

(56) References Cited

U.S. PATENT DOCUMENTS

| | | | | |
|---|---|---|---|---|
| 8,803,258 B2* | 8/2014 | Gozzini | G06K 9/00053 257/415 | |
| 2002/0160363 A1* | 10/2002 | McDevitt | C12Q 1/37 435/6.12 | |
| 2004/0185590 A1* | 9/2004 | Miyai | G06K 9/00053 438/48 | |
| 2005/0259853 A1* | 11/2005 | Miyai | G06K 9/00053 382/124 | |
| 2007/0229470 A1* | 10/2007 | Snyder | G06F 3/011 345/173 | |
| 2008/0210757 A1* | 9/2008 | Burden | G07D 7/02 235/449 | |
| 2009/0067690 A1* | 3/2009 | Mainguet | G06K 9/00053 382/124 | |
| 2010/0271330 A1* | 10/2010 | Philipp | G06F 3/044 345/174 | |
| 2011/0254108 A1* | 10/2011 | Gozzini | G06K 9/00053 257/415 | |
| 2011/0267298 A1* | 11/2011 | Erhart | G06F 1/1626 345/173 | |
| 2012/0065617 A1* | 3/2012 | Matsiev | G01N 27/4166 604/503 | |
| 2013/0201153 A1* | 8/2013 | Schneider | G06F 3/044 345/174 | |
| 2013/0259329 A1* | 10/2013 | Wickboldt | H05K 1/189 382/124 | |
| 2014/0333328 A1* | 11/2014 | Nelson | G06F 3/044 324/663 | |
| 2015/0091588 A1* | 4/2015 | Wickboldt | G06K 9/00013 324/661 | |
| 2015/0091859 A1* | 4/2015 | Rosenberg | G06F 3/044 345/174 | |
| 2015/0198699 A1* | 7/2015 | Kuo | G01S 7/52017 367/7 | |

* cited by examiner ately located vertically on top of said pixel resulting in image blurring negatively impacting the capabilities of the sensors to resolve fine features in a fingerprint.

FINGERPRINT SENSING DEVICE WITH HETEROGENEOUS COATING STRUCTURE COMPRISING AN ADHESIVE

CROSS-REFERENCE TO RELATED APPLICATIONS

This application claims the benefit of Swedish Patent Application No. 1550748-6 filed Jun. 8, 2015. The disclosure of the above application is incorporated herein by reference in its entirety.

FIELD OF THE INVENTION

The present invention relates to a coating structure for a fingerprint sensor. In particular, the present invention related to a heterogeneous coating structure for enhancing the performance in a fingerprint sensor.

BACKGROUND OF THE INVENTION

As the development of biometric devices for identity verification, and in particular of fingerprint sensing devices, has lead to devices which are made smaller, cheaper and more energy efficient, the possible applications for such devices are increasing.

In particular fingerprint sensing has been adopted more and more in, for example, consumer electronic devices, due to small form factor, relatively beneficial cost/performance factor and high user acceptance.

Capacitive fingerprint sensing devices, built based on CMOS technology for providing the fingerprint sensing elements and auxiliary logic circuitry, are increasingly popular as such sensing devices can be made both small and energy efficient while being able to identify a fingerprint with high accuracy. Thereby, capacitive fingerprint sensors are advantageously used for consumer electronics, such as portable computers, tablet computers and mobile phones, e.g. smartphones.

A fingerprint sensing chip typically comprises an array of capacitive sensing elements providing a measure indicative of the capacitance between several sensing structures and a finger placed on the surface of the fingerprint sensor. The sensing chip may further comprise logic circuitry for handling addressing of the array of sensing elements.

A typical fingerprint sensor is protected so that the finger does not come in physical contact with the sensing elements. In particular, it may be desirable to arrange a glass plate on top of the sensor for protecting the sensor, or to arrange the sensor behind a display glass. By arranging elements between the sensing surface and the sensing elements, the distance between the sensing surface and the sensing elements increases which reduces the capacitive coupling between a finger placed a sensing surface of the device and the capacitive sensing elements. This in turn leads to an image blurring effect. As a function of an increased distance between a finger and any given pixel, each pixel is starting to receive signals from areas that are not immediately located vertically on top of said pixel resulting in image blurring negatively impacting the capabilities of the sensors to resolve fine features in a fingerprint.

In view of the above, it is desirable to improve the capacitive coupling between a finger placed on the sensing surface and the sensing elements.

US2013/0201153 discloses a fingerprint sensing device where electrically conductive strands are arranged between the sensing surface and the sensing elements of a fingerprint sensing device. An insulating material is arranged between conductive strands. However, a direct electrical contact between the finger and the pixel may cause problems related to electrostatic discharge (ESD). Moreover, the metallic portions of the surface may oxidize, resulting in undesirable aesthetic effects.

SUMMARY

In view of above-mentioned desirable properties of a fingerprint sensing device, and drawbacks of prior art, it is an object of the present invention to provide a fingerprint sensing device and a method for manufacturing a fingerprint sensing device which provides an improved capacitive coupling between a finger placed on a sensing surface and the sensing elements of the sensing device.

According to a first aspect of the invention, there is provided a fingerprint sensing device comprising: a sensing chip comprising an array of sensing elements, the sensing elements being configured to be connected to readout circuitry for detecting a capacitive coupling between each of the sensing elements and a finger placed on a sensing surface of the sensing device; a coating material arranged in a layer on top of the array of sensing elements, the coating material comprising a plurality of cavities filled with an adhesive; wherein locations of the cavities correspond to locations of the sensing elements, such that a cross-section area of a cavity covers at least a portion of an area of a corresponding sensing element; and wherein a dielectric constant of the adhesive is higher than a dielectric constant of the coating material; and a protective plate attached to the sensing chip by means of the adhesive.

The sensing chip should in the present context be understood as a chip comprising a plurality of sensing elements in the form of conductive plates or pads, typically arranged in an array, which are capable of forming a capacitive coupling between each sensing element and a finger placed on an exterior surface of the fingerprint sensing device. Through readout of the capacitive coupling for each sensing element, ridges and valleys of a fingerprint can be detected as a result of the distance dependence of the capacitive coupling. To achieve a fingerprint image with sufficient resolution, the sensing elements are typically substantially smaller than the features (ridges and valleys) of the finger. In general, a chip may also be referred to as a die.

The protective plate typically comprises a dielectric material in order to provide a good capacitive coupling between a finger placed on the plate and the sensing elements of the sensing chip. In particular, the protective plate may advantageously comprise a glass or ceramic material, such as a chemically strengthened glass, $ZrO_2$ or sapphire. The aforementioned materials all provide advantageous properties in that they are hard and thereby resistant to wear and tear, and in that they are dielectric thereby providing a good capacitive coupling between a finger placed on the surface of the protective plate and the sensing element of the sensing device. The protective plate described herein commonly forms the outer surface of the fingerprint sensing device, also referred to as the sensing surface.

The sensing device according to various embodiments of the invention may be formed on a conventional rigid PCB substrate or it may be implemented using a flexible type of substrate.

An improved capacitive coupling between a finger and a sensing element can be achieved by forming a heterogeneous coating layer where portions of the layer above the sensing elements have a higher dielectric constant than surrounding portion, thereby focusing the electric field towards the respective sensing element. Furthermore, the present invention is based on the realization that the adhesive used to attach a protective plate to the sensing device can be used to achieve this effect by selecting or forming an adhesive having a dielectric constant which is higher than the surrounding material. Thereby, an improved capacitive coupling can be achieved without substantial alterations of the material stack, meaning that conventional manufacturing processes may be used.

That a cross-section area of a cavity covers at least a portion of an area of a corresponding sensing element means should be interpreted to mean that the cavity may or may not cover the complete area of the sensing element. Moreover, it is not required that the cavity is centered over the sensing element, although it very well may be.

Furthermore, it is important to note that the cavity should be understood as a cavity in the coating material, which is subsequently filled with an adhesive.

The coating material may refer to any material which is arranged to cover the sensing chip and in particular the sensing elements. The coating material is often referred to as wafer coating, and it may also function as an interposer structure.

According to one embodiment of the invention, the coating material may comprise one cavity for each sensing element. Although it is not strictly required that there is a 1:1 ratio of the number of cavities to the number of sensing elements, this is most likely how the greatest improvement in capacitive coupling can be achieved. However, there may be instances where it is desirable to only have cavities over some of the sensing elements. For example, for various reasons it may be difficult to separate adjacent cavities, in which case a pattern where cavities are only located above a select number of sensing elements can be utilized.

According to one embodiment of the invention, the dielectric constant of the adhesive may be in the range of 5-100 and the dielectric constant of the coating material may be in the range of 2-5. The specified ranges are should be seen as exemplary ranges providing the desired effect. The adhesive and the coating material may have dielectric constants outside of the specified ranges within the scope of various embodiments of the present invention.

Furthermore, the ratio between the dielectric constant of the adhesive and the dielectric constant of said coating material may advantageously be selected to be equal to or larger than 2:1. With respect to the focusing effect, it is the ratio between the two dielectric constants which determines the amount of focusing, where a higher ratio provides a better focus. It should be noted that the above mentioned dielectric constants and ratio is merely an example, and that a desired advantageous effect can be achieved with in principle any ratio higher than 1, although the effect is increasing with increasing ratio.

In one embodiment of the invention, the adhesive may advantageously comprise filler particles having a dielectric constant higher than an average dielectric constant of the adhesive, which is one way of tailoring the average dielectric constant of the adhesive. The filler particles may be referred to as dielectric filler particles or high-k filler particles. Thereby, the dielectric constant of the adhesive can be selected so that a desirable ratio can be achieved for different choices of coating material. Moreover, one and the same adhesive material can be used while providing different dielectric constants depending on what is required for a particular application. This simplifies the manufacturing process since there is no need to adjust the process for different adhesive.

According to one embodiment of the invention, the filler particles may advantageously comprise a ferroelectric material, such as barium titanate ($BaTiO_3$). There are a range of ferroelectric materials which have a high dielectric constant, and which may be suitable for use as filler material. Other filler particles may of course also be used, such as aluminum oxide ($Al_2O_3$). One desirable property is that the filler material should be possible to be provided in a form which may be evenly mixed with an adhesive, and that the filler material does not agglomerate in the adhesive since it is important that the dielectric constant of the adhesive is at least approximately homogeneous over the entire surface of the sensing device.

In one embodiment of the invention, each of the cavities may advantageously comprise at least one lateral opening connecting the cavity to at least one adjacent cavity, enabling a flow of the adhesive between adjacent cavities when depositing the adhesive. During manufacturing of the fingerprint sensing device, the adhesive is typically provided in the form of a liquid adhesive onto the coating structure comprising cavities. It is desirable to achieve a homogeneous thickness distribution of the adhesive when the protective plate is being attached to the sensing device, both to provide good adhesion and to provide uniformity in measurements over the entire sensing surface. By means of the lateral openings in the coating layer, fluidly connecting adjacent cavities, the adhesive can flow between the cavities to form an even distribution as the protective plate is being places onto the sensing device.

According to one embodiment of the invention, the coating material may advantageously be a photoresist. By using a photoresist, the cavities can be formed using conventional photolithography and development processes, which simplifies the overall process flow. Moreover, a photoresist can easily be tailored to have a specific dielectric constant so that a desired ratio of dielectric constants can be achieved. Furthermore, a photoresist can be deposited on a full wafer with a high degree of accuracy and thickness uniformity, using for example spin coating or spray coating.

According to a second aspect of the invention, there is provided a method for manufacturing a fingerprint sensing device, the method comprising; providing a sensing chip comprising an array of sensing elements, the sensing elements being configured to be connected to readout circuitry for detecting a capacitive coupling between each of the sensing elements and a finger placed on a sensing surface of the sensing device; depositing a layer of a coating material covering the array of conductive sensing elements; forming a plurality of cavities in the coating material, wherein locations of the cavities correspond to locations of the sensing elements such that a cross-section area of a cavity covers at least a portion of an area of a corresponding sensing element; providing an adhesive to fill the cavities, the adhesive having a dielectric constant higher than a dielectric constant of the coating material; and attaching a protective plate to the sensing device by means of the adhesive.

The coating material is preferably arranged in a homogeneous layer on the sensing chip to cover the sensing elements.

According to one embodiment of the invention the coating layer may advantageously be deposited by spin coating or by spray coating, which can be done on a full wafer thereby providing a large-scale efficient process. Using spin coating or spray coating also allows the process to be easily modified with respect to the desired thickness of the coating layer.

In one embodiment of the invention the, method may further comprise plasma cleaning of the coating material prior to the step of providing the adhesive. The plasma cleaning of the surface of the coating material provides a surface with improved adhesion to the adhesive. Thereby, a better adhesion between the sensing chip and the sensing chip and the protective plate is achieved.

According to one embodiment of the invention, providing the adhesive may advantageously comprise dispensing a liquid adhesive on the layer of coating material and in said cavities. A liquid adhesive is advantageous in that the cavities are easily filled and in that a homogeneous thickness distribution can be achieved. However, it is equally possible to deposit an adhesive by spin coating or spray coating or in the form of a film. Moreover, the adhesive may be deposited on a full wafer comprising a plurality of sensing chips, or the adhesive may be deposited in a single sensing chip after dicing of the wafer.

According to one embodiment of the invention, the coating material may advantageously be a photoresist, and forming a plurality of cavities in the coating material may then comprise patterning the layer of coating material by means of photolithography.

Additional advantages, effects and features of the second aspect of the invention are largely analogous to those described above in connection with the first aspect of the invention.

According to a third aspect of the invention, there is provided a fingerprint sensing device comprising: a sensing chip comprising an array of sensing elements, the sensing elements being configured to be connected to readout circuitry for detecting a capacitive coupling between each of the sensing elements and a finger placed on a sensing surface of the sensing device; a coating material arranged in a layer on top of the array of sensing elements, the coating material comprising a plurality of trenches filled with an adhesive; wherein the trenches are aligned with areas between the sensing elements; and wherein a dielectric constant of the adhesive is lower than a dielectric constant of the coating material; and a protective plate attached to the sensing chip by means of the adhesive.

The trenches in the coating material can be considered to follow the alignment of the border between sensing elements. Typically, the sensing elements are arranged in a square array with a certain pitch, here defined as the center-to-center distance of the sensing elements, where the pitch is larger than the size of the sensing element, thereby forming an unoccupied area between adjacent sensing elements.

By providing an adhesive in the trenches, where the dielectric constant of the adhesive is lower than a dielectric constant of the coating material, a heterogeneous coating layer is provided and the focusing effect discussed in relation to the first aspect of the invention is achieved.

Additional advantages, effects and features of the third aspect of the invention are largely analogous to those described above in connection with the first aspect of the invention.

According to a fourth aspect of the invention, there is provided a method for manufacturing a fingerprint sensing device, the method comprising; providing a sensing chip comprising an array of sensing elements, the sensing elements being configured to be connected to readout circuitry for detecting a capacitive coupling between each of the sensing elements and a finger placed on a sensing surface of the sensing device; depositing a layer of a coating material covering the array of sensing elements; forming a plurality of trenches in the coating material, wherein the trenches are aligned with areas between the sensing elements; providing an adhesive to fill the trenches, the adhesive having a dielectric constant lower than a dielectric constant of the coating material; and attaching a protective plate to the sensing device by means of the adhesive.

Additional advantages, effects and features of the fourth aspect of the invention are largely analogous to those described above in connection with the first, second and third aspect of the invention.

Further features of, and advantages with, the present invention will become apparent when studying the appended claims and the following description. The skilled person realize that different features of the present invention may be combined to create embodiments other than those described in the following, without departing from the scope of the present invention.

BRIEF DESCRIPTION OF THE DRAWINGS

These and other aspects of the present invention will now be described in more detail, with reference to the appended drawings showing an example embodiment of the invention, wherein.

DETAILED DESCRIPTION OF EXAMPLE EMBODIMENTS

In the present detailed description, various embodiments of a fingerprint sensing device according to the present invention are mainly discussed with reference to a capacitive fingerprint sensing device. A method for manufacturing a fingerprint sensing device is also discussed.

Figure 1:
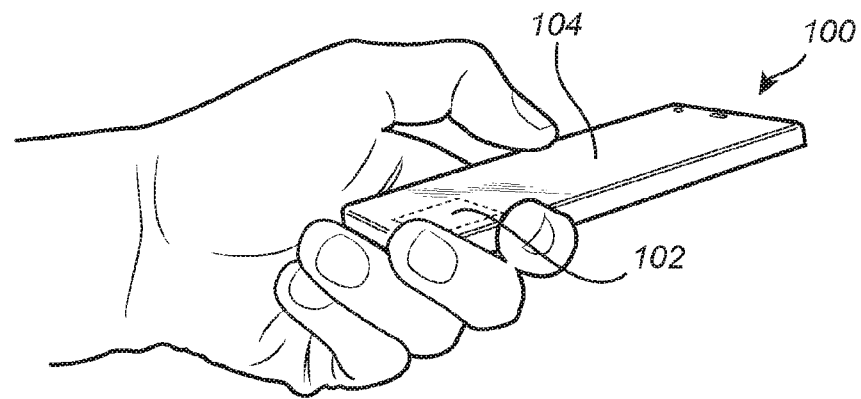
FIG. 1 schematically illustrates a handheld electronic device comprising a fingerprint sensing device according to an embodiment of the invention.

FIG. 1 is a schematic illustration of a handheld device 100 comprising a fingerprint sensing device 102 comprising a touchscreen display 104. A fingerprint sensing device 102 can be used in for example a mobile phone, a tablet computer, a portable computer or any other electronic device requiring a way to identify and/or authenticate a user.

Figure 2A:
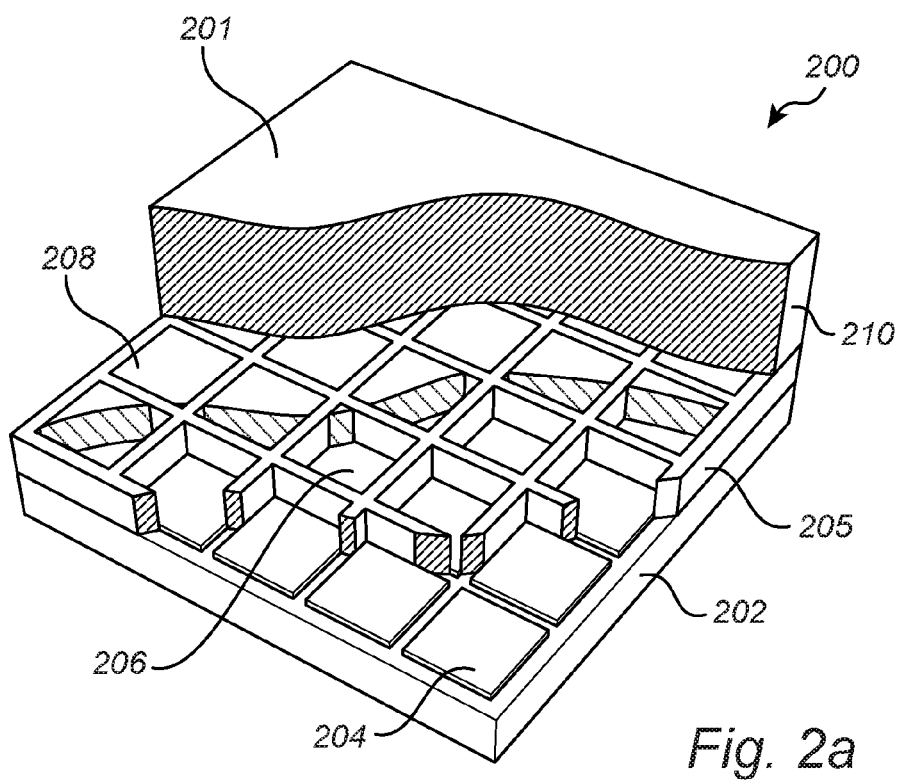
FIGS. 2a-b schematically illustrate a fingerprint sensing device according to an embodiment of the invention.

FIG. 2a is a schematic illustration of a fingerprint sensing device 200 according to an embodiment of the invention. The exterior surface 201 of the sensing device 200 is referred to as the sensing surface, since that is the surface where a finger will be placed for capturing a fingerprint image. The fingerprint sensing device is based on a sensing chip 202 comprising an array of sensing elements 204. The sensing elements 204 are here shown arranged in a square array, the sensing elements having a size of about 50×50 μm and a distance between adjacent elements is about 5 μm. The sensing elements 204 are electrically conductive, typically metallic, and can as a general approximation be considered to act as one plate in a parallel plate capacitor, where a finger placed on a sensing surface 201 of the fingerprint sensing device 200 represents the other plate. Each sensing element 204 is connected to readout circuitry (not shown) for detecting a capacitive coupling between each of said sensing elements 204 and a finger placed on the sensing surface 201.

A coating material 205 is arranged in a layer on top of the array of sensing elements 204, and the coating material comprises a plurality of cavities 206 which are filled by an adhesive 208 which is used to attach the protective plate 210 to the sensing chip. The protective plate 210 may for example be a sapphire plate having a thickness in the range of 100-1000 μm. The protective plate may also be the cover glass in a handheld device comprising a touch screen, and a cover glass covering the fingerprint sensing device may also be covering the display and touchscreen portions of the handheld device. In principle, the protective plate may be any structure which acts to cover and protect the sensing device while still allowing a capacitive coupling between a finger placed on the surface of the protective plate and the sensing elements.

Figure 2B:
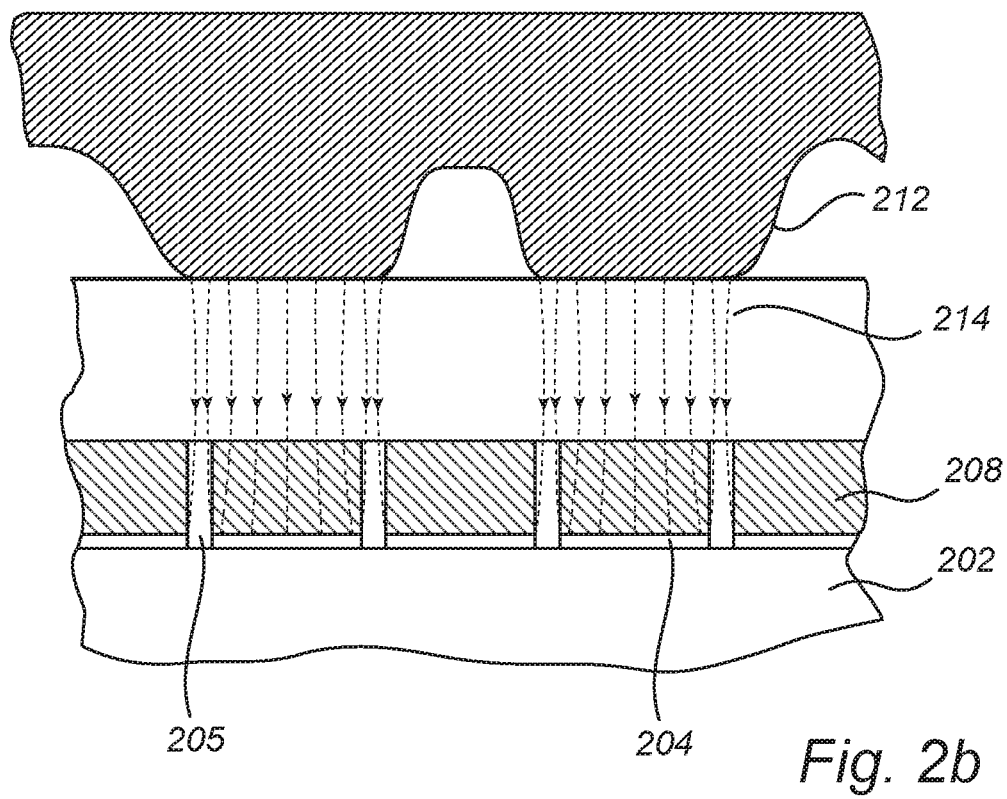

The cavity 206 may also be referred to as an opening, or a recess, in the coating material 205. The purpose of the cavities 206 is to allow an adhesive to be arranged directly above the sensing elements 204, so that the adhesive 208 is arranged between the sensing element 204 and the sensing surface 201. The adhesive, which has a dielectric constant that is higher than a dielectric constant of the coating material, will then act as a focusing element helping to focus the electromagnetic field lines between a finger and the sensing element 204 towards the sensing element 204. This effect is further illustrated in FIG. 2b showing a side view of the fingerprint sensing device 200 where a ridges and valleys of a finger 212 are located on the sensing surface 201. It can be seen that the field lines 214 originating in a position on the sensing surface not located directly above a sensing element 204 are curved towards the cavities in the coating comprising the adhesive 208 due to the higher dielectric constant of the adhesive 208. Moreover, the coating material having a lower dielectric constant than the dielectric act as a blocking structure in order to reduce or prevent field lines from a fingerprint ridge from reaching a sensing element 204 not located directly beneath the ridge. Accordingly, the patterned coating layer helps to prevent blurring of a captured image, since the non-vertical coupling between the finger and sensing elements is reduced. In FIG. 2b, the field is lower in the coating material compared to in the adhesive, due to the difference in dielectric constant.

In principle, it is the ratio between the dielectric constants of the coating material and the adhesive which determines the distribution of the field lines. Already a ratio of 2:1 provides an advantageous effect, whereas a ratio in the range of 1:10 to 1:20 is more preferable. The dielectric constants of the materials discussed herein are the average relative dielectric constants of the material. The respective materials may for example be compositions and comprise particles having individually different dielectric constants, which together with the bulk material provide a resulting average dielectric constant. For example, an adhesive with an increased dielectric constant can be achieved by using a conventional adhesive and add particles of a ferroelectric material such as barium titanate (BaTiO3) which in itself has a dielectric constant above 1000. By selecting the type and concentration of the added material, and adhesive, and also a coating material, can be tailored to have the desired dielectric constant within a reasonable range, such as between 2 and 100. The resulting dielectric constant $\in_{\mathit{eff}}$ for a mixture of components having different dielectric constants $\in_1$, $\in_2$, can be determined according to the Lichtenecker model as $$\log \in_{\mathit{eff}} = v_1 \log \in_1 + v_2 \log \in_2$$

where $v_1$ and $v_2$ are empirically determined constants.

From FIGS. 2a and 2b it can also be seen that the adhesive 208 has the same thickness as the coating layer 205, so that the protective plate 210 rests on the coating layer 205. This has the advantageous effect that the protective plate 210 can be arranged to rest on a surface which is substantially even over the area of the sensing chip. This is a result of the good thickness uniformity which can be achieved when depositing the coating layer 205, for example using spin coating. It is of course also possible that the adhesive 208 may reach slightly higher than the depth of the cavities 206, so that all or major portions of the area of the sensing chip is covered by the adhesive 208. This will provide improved adhesion between the sensing chip and the protective plate 210 with only marginal influence on the capacitive coupling between the finger and the sensing element 204.

Figure 3A:
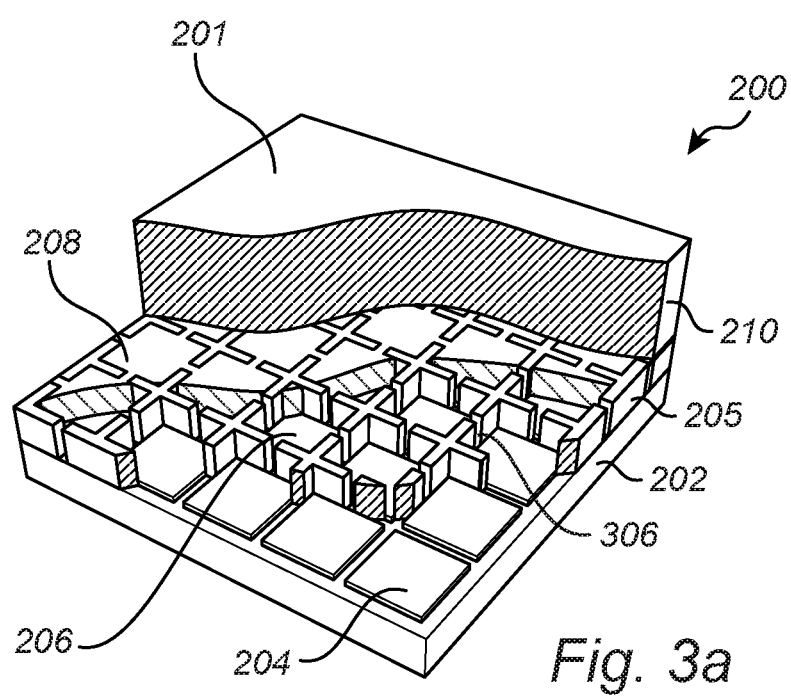
FIGS. 3a-b schematically illustrate a fingerprint sensing device according to embodiments of the invention.

FIG. 3a is a schematic illustration of a fingerprint sensing device according to an embodiment of the invention where adjacent cavities 206 in the coating material are connected via channels 306, or openings 306, in the side walls of the cavities. The channels 306 allow a liquid adhesive to flow between cavities during deposition of the adhesive, as will be discussed in further detail in relation the method for manufacturing a fingerprint sensing device. The openings 306 between adjacent cavities are configured to be larger than the particle size of any filler particles present in the adhesive 208, so that the adhesive can flow freely between the cavities without the risk of filler particles clogging the openings. Preferably, the openings have a size larger than a maximum size of the filler particles. A typical maximum particle size may be in the range of 1-3 μm for ferroelectric particles such as BaTiO$_3$ particles. However, filler particles having a high dielectric constant may also be provided in the form of nanoparticles having a sub-μm diameter. Accordingly, the openings 306 between adjacent cavities can be selected based on the size of the filler particles and based on the method for patterning the coating layer, and a practical size of the openings 306 may be in the range of 5-10 μm. Furthermore, the adhesive may comprise additional filler particles in order to tailor parameters such as the viscosity and the thermal expansion coefficient of the adhesive. The openings may be adapted to have a size larger than a maximum size of also such filler particles. However, it is prioritized to ensure that dielectric particles influencing the dielectric constant of the adhesive can flow freely so that a homogeneous dielectric constant can be achieved in the adhesive over the full area of the sensing chip.

Figure 3B:
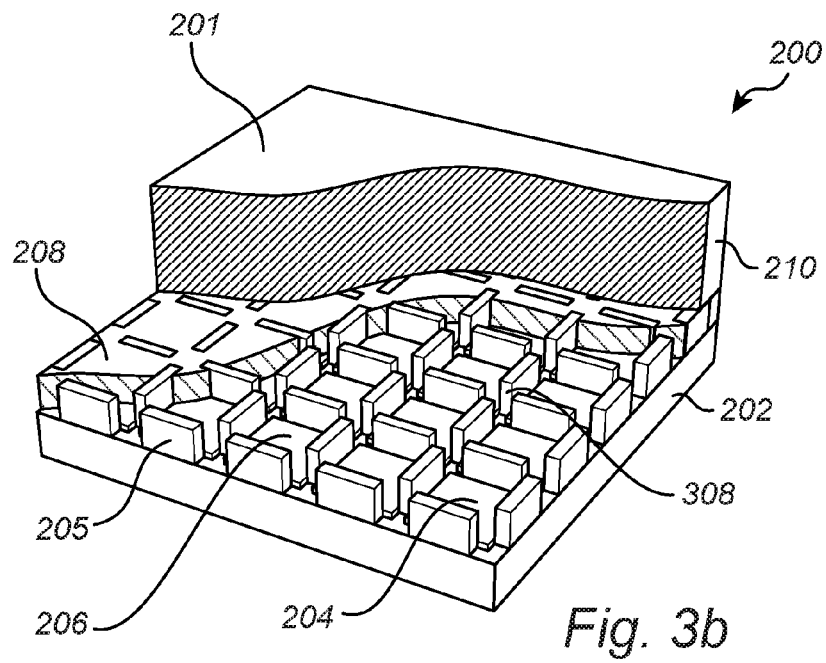

FIG. 3*b* is a schematic illustration of a fingerprint sensing device according to an embodiment of the invention where openings 308 connecting adjacent cavities 206 in the coating material are located at the corners of the sensing elements 204. It should be understood that the openings connecting adjacent cavities may be configured in many different ways to achieve the desired effect of allowing the adhesive to flow between adjacent cavities.

Figure 4:
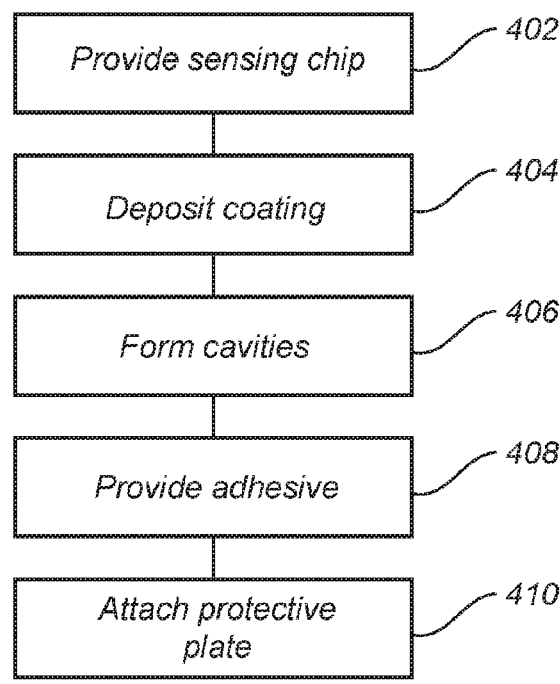
FIG. 4 is a flow chart outlining the general steps of a method for manufacturing a fingerprint sensing device according to an embodiment of the invention.

FIG. 4 is a flow chart outlining the general steps of a manufacturing method according to an embodiment of the invention. The manufacturing method will be discussed also with reference to FIGS. 5*a-c*.

First, in step 402, a sensing chip 202 is provided and a coating layer is deposited 404 onto the sensing chip 202. The coating layer typically has a uniform thickness and is arranged to cover the entire area of the sensing chip. The coating layer can for example be a photoresist deposited by spin-coating, and the photoresist may be either a positive or a negative photoresist. Moreover, spin- and spray-coating typically provides a homogeneous thickness of the coating layer which simplifies subsequent adhesion of the protective plate.

Figure 5A:
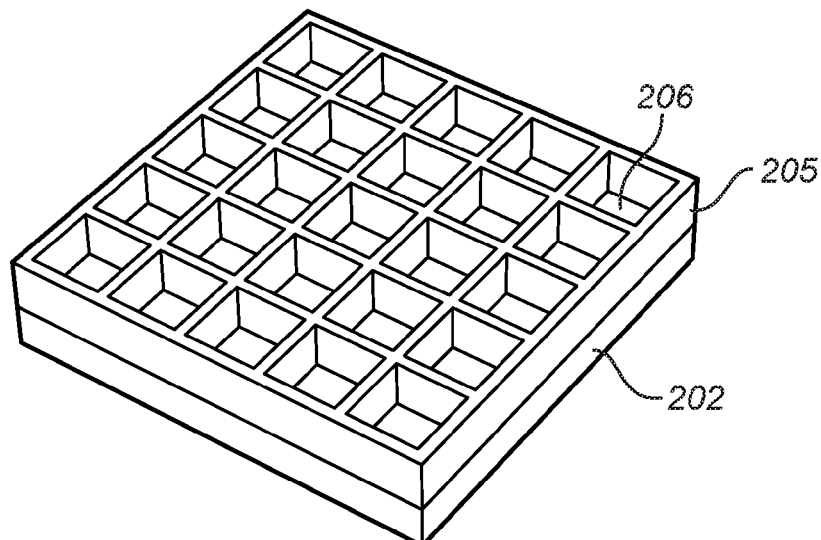
FIGS. 5a-c schematically illustrate a method for manufacturing a fingerprint sensing device according to an embodiment of the invention.

Cavities 206 are formed 406 in the coating layer 205 by means of conventional photolithography and subsequent development to form cavities having the desired shape and distribution, as exemplified in FIG. 5*a*. Typically, the cavities are configured to reach through the coating layer to expose the sensing element. Moreover, the sensing element may be covered by a silicon nitride-based passivation layer (not shown) which is well known in the field of CMOS-processing. However, a certain small thickness of the coating material remaining in the cavities would not substantially influence the overall properties of the sensing device 200. In general, each cavity 206 is centered above a corresponding sensing element 204, having the same shape as the sensing element 204, and the size of the cavity is preferably as close as possible to the size of the sensing element 204. However, the remaining side walls between cavities must be sufficiently thick so as to maintain structural stability. As an example, for sensing elements having a size of 50×50 µm, the coating layer has a thickness of approximately 30 µm and the cavities preferably have a size in the range of 30×30 to 40×40 µm.

After forming the cavities, the coating layer may be treated in a plasma cleaning process in order to improve adhesion between the coating and the subsequently deposited adhesive. The plasma cleaning may for example comprise oxygen mixed with an inert gas such as nitrogen or argon.

Figure 5B:
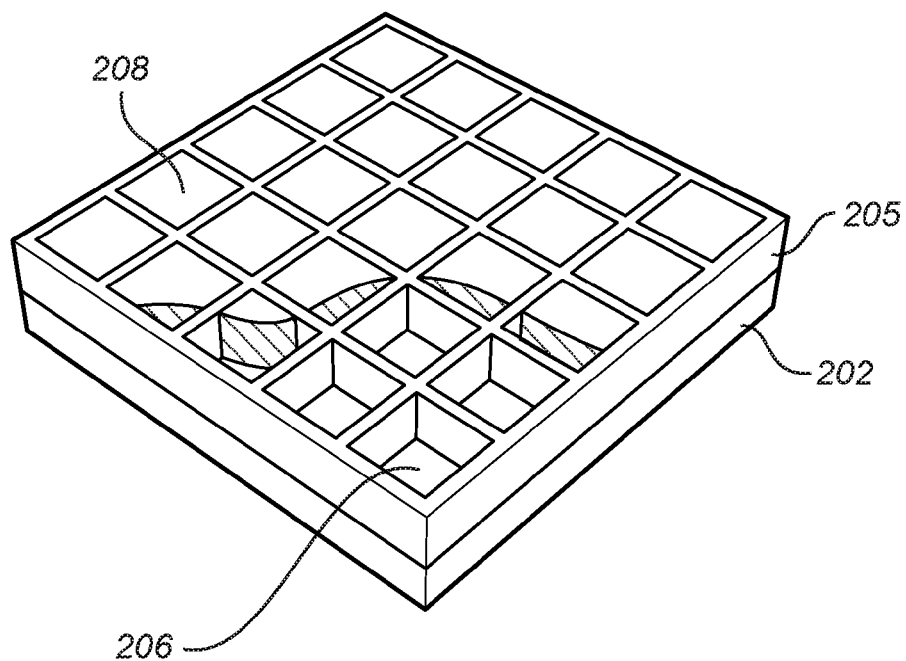

As a next step, a liquid adhesive 208 is provided 408 by dispensing the adhesive 208 onto the coating layer 205 so that the adhesive 208 fills the cavities, as illustrated in FIG. 5*b*.

Figure 5C:
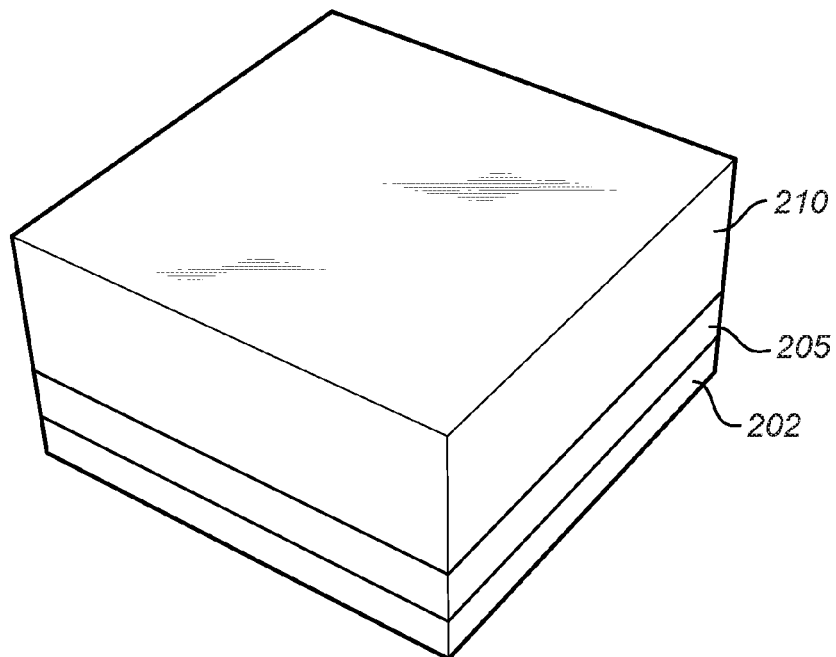

In the final step as illustrated in FIG. 5*c*, a protective plate 210 is attached 410 to the sensing device by means of the adhesive 208. After the adhesive has been applied on the wafer, there could be a drying step involved (sometimes referred to as beta stage curing) to partially dry the adhesive. In case of curing, the protective plate can be attached to the partially cured/dried adhesive in a subsequent assembly step by applying heat and pressure.

Figure 6:
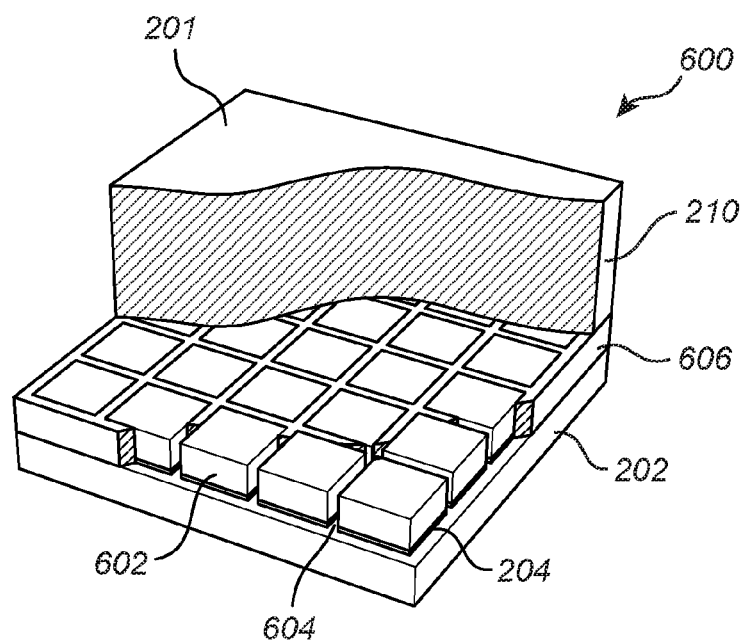
FIG. 6 schematically illustrates a fingerprint sensing device according to an embodiment of the invention.

FIG. 6 is a schematic illustration of a fingerprint sensing device 600 according to another embodiment of the invention. The fingerprint sensing device is based on a sensing chip 202 comprising a square array of sensing elements 204. In many aspects, the sensing device 600 of FIG. 6 is similar to the sensing device of FIG. 2*a*. However, the sensing device 600 comprises a coating layer 602 having a plurality of trenches 604 filled with an adhesive 606. The trenches 604 are aligned with areas between the sensing elements 204. Moreover, the dielectric constant of the adhesive 606 is lower than a dielectric constant of the material of the coating layer 602. The coating 602, will then act as a focusing element helping to focus the electromagnetic field lines between a finger and the sensing element 204 towards the sensing element 204 in a similar manner as discussed in relation to FIGS. 2*a* and 2*b*. Moreover, the dielectric constant of the coating can be tailored using dielectric filler particles in the same manner as discussed above for the adhesive.

Figure 7:
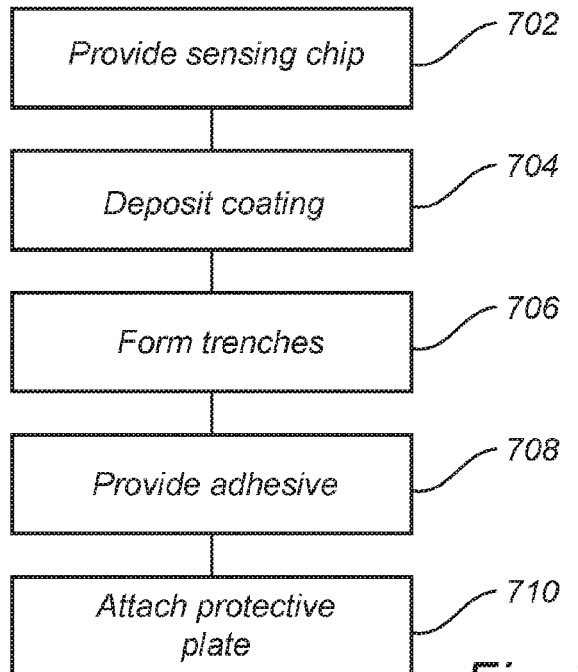
FIG. 7 is a flow chart outlining the general steps of a method for manufacturing a fingerprint sensing device according to an embodiment of the invention.

FIG. 7 is a flow chart outlining the general steps of a manufacturing method according to an embodiment of the invention. The manufacturing method will be discussed also with reference to FIGS. 8*a-c*.

First, in step 702, a sensing chip 202 is provided and next a coating layer is deposited 704 onto the sensing chip 202. The coating layer typically has a uniform thickness and is arranged to cover the entire area of the sensing chip including the sensing elements 204. The coating layer can for example be a photoresist deposited by spin-coating, and the photoresist may be either a positive or a negative photoresist. In order to achieve a coating material having a dielectric constant higher than the dielectric constant of the adhesive material, filler particles may be mixed with the coating material. The filler particles can be similar to the filler particles discussed above in relation to the embodiment illustrated by FIGS. 2*a-b*.

Figure 8A:
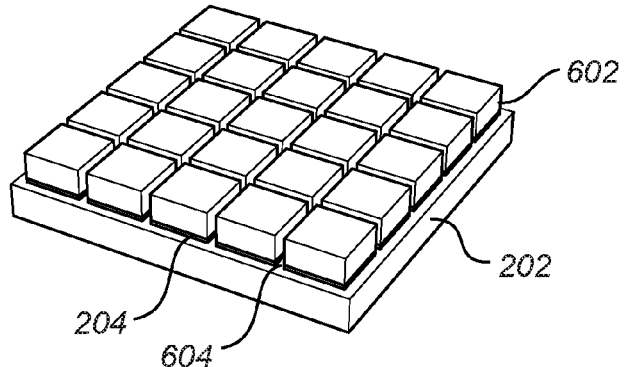
FIGS. 8a-c schematically illustrate a method for manufacturing a fingerprint sensing device according to an embodiment of the invention.
Figure 8B:
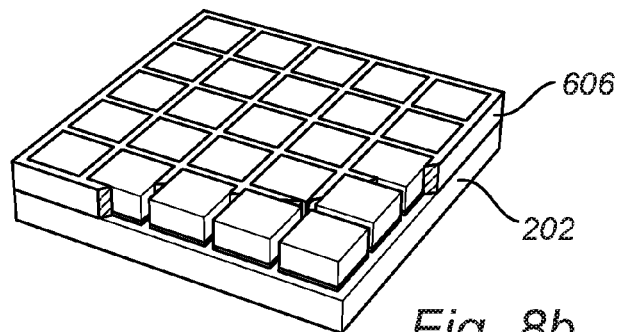

Trenches 604 are formed 706 in the coating layer by means of conventional photolithography and subsequent development to form trenches having the desired shape and orientation, as exemplified in FIG. 8*a*. In general, trenches are aligned with areas between the sensing elements 204. The remaining coating 602 thus form square structures arranged on top of and aligned with the sensing elements 204.

After forming the trenches in the coating layer, the adhesive 606 is provided 708, for example by dispensing a liquid adhesive, so that the adhesive 606 fills the trenches 604.

Figure 8C:
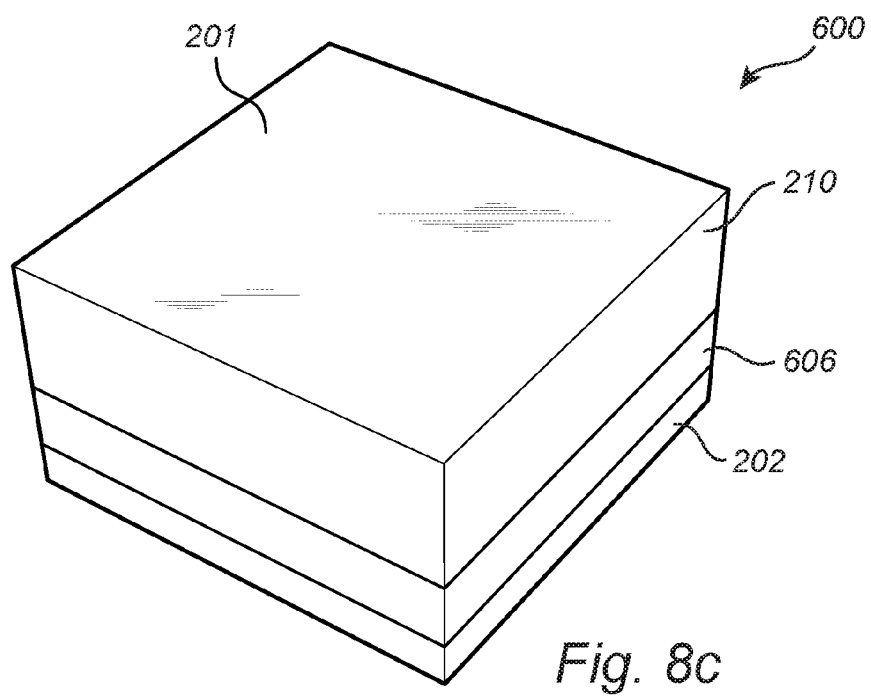

Finally, the protective plate 210 is attached 710 to the sensing chip by means of the adhesive 606 so that the exterior surface 201 of the protective plate acts as a sensing surface of the fingerprint sensing device 600, as illustrated in FIG. 8*c*.

Figure 9:
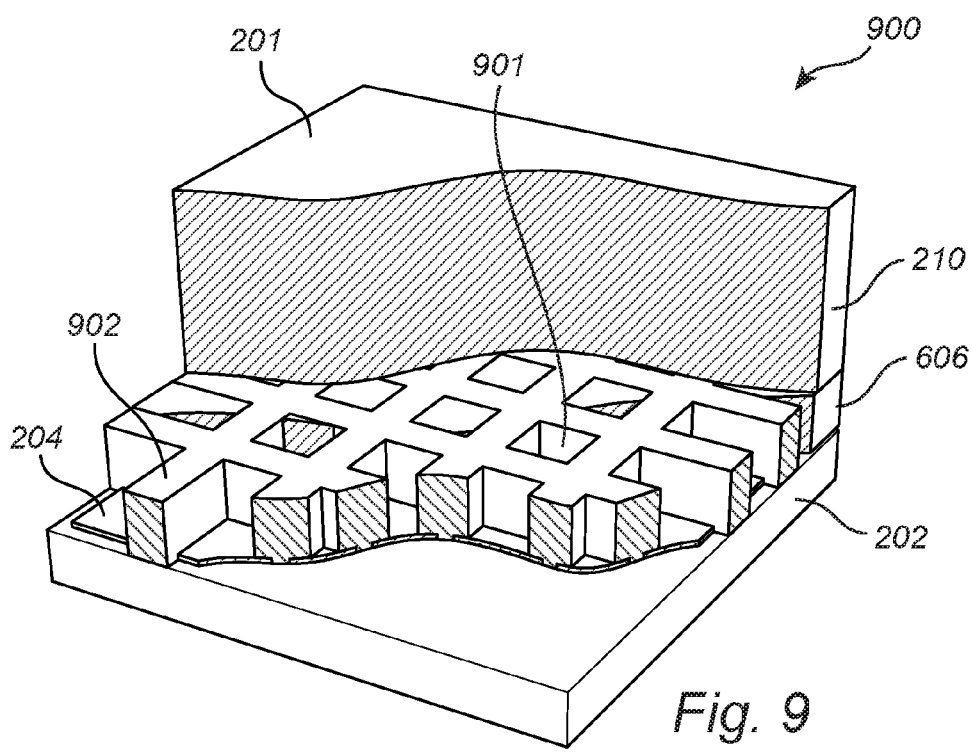
FIG. 9 schematically illustrates a fingerprint sensing device according to an embodiment of the invention.

FIG. 9 schematically illustrates a fingerprint sensing device 900 according to an embodiment of the invention. In most respects, the sensing device 900 is similar to the sensing device illustrated in FIG. 2*a*. However, in the sensing device of FIG. 9, the cavities 901 are smaller, meaning that the side walls 902 surrounding the cavities 901 are thicker, and that they extend out over a portion of the sensing elements 204. In order to ensure sufficient structural stability of the side walls 902, it may be desirable to have side walls 902 which are thicker than the distance between adjacent elements. Furthermore, the advantageous effects relating to the higher dielectric constant of the adhesive in the cavities remains also for smaller cavities, although the effect is approximately proportional to the size of the cavities.

The above example embodiments have been described using a photoresist as the coating layer. However, various advantages of the present inventive concept are achievable using another coating material. For example, the coating material may comprise a deposited hard mask which is subsequently patterned by for example deep reactive ion etching (DRIE).

Figure 10A:
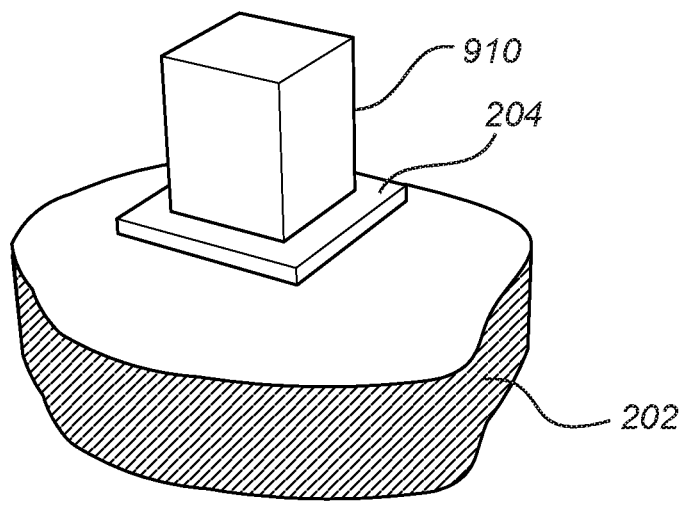
FIGS. 10a-b schematically illustrate details of a fingerprint sensing device according to embodiments of the invention.
Figure 10B:
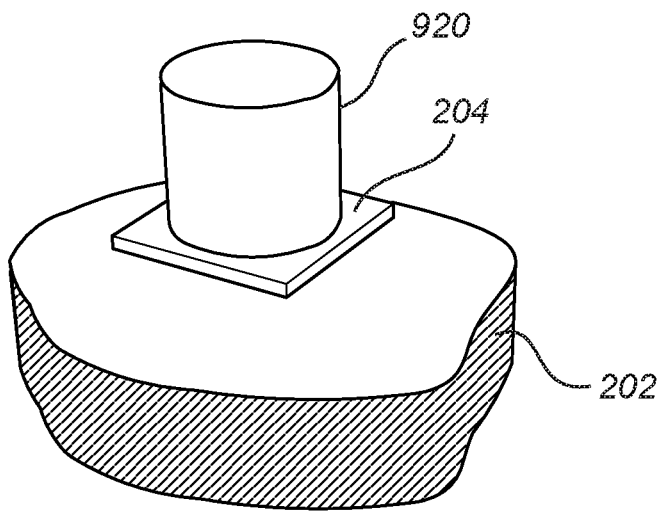

FIG. 10a is a schematic illustration of a sensing element 204 of a sensing device. Here, a rectangular cuboid structure 910 representing either coating or adhesive according to the various embodiments discussed above is arranged on the sensing element 204. In FIG. 10b, a cylindrical structure 920 representing either coating or adhesive according to the various embodiments discussed above is arranged on the sensing element 204. FIGS. 10a-b are meant to illustrate that the portion located above the sensing element, and which has a higher dielectric constant that the dielectric constant of a surrounding material, may in principle have an arbitrary shape. The shape may for example be selected based on what is most desirable from a manufacturing perspective.

It should be noted that the general aspects of the invention discussed herein are not limited to the specific dimensions and sizes disclosed in the present description. The above description merely provides an example embodiment of the inventive concepts as defined by the claims.

Even though the invention has been described with reference to specific exemplifying embodiments thereof, many different alterations, modifications and the like will become apparent for those skilled in the art. Also, it should be noted that parts of the device and method may be omitted, interchanged or arranged in various ways, the device and method yet being able to perform the functionality of the present invention.

Additionally, variations to the disclosed embodiments can be understood and effected by the skilled person in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measured cannot be used to advantage.

What is claimed is:

1. A fingerprint sensing device comprising:
   a sensing chip comprising an array of sensing elements, said sensing elements being configured to be connected to readout circuitry for detecting a capacitive coupling between each of said sensing elements and a finger placed on a sensing surface of said sensing device;
   a coating material arranged in a layer on top of said array of sensing elements, said coating material comprising a plurality of cavities filled with an adhesive; wherein locations of said cavities correspond to locations of said sensing elements, such that a cross-section area of a cavity covers at least a portion of an area of a corresponding sensing element; and wherein a dielectric constant of said adhesive is higher than a dielectric constant of said coating material and a dielectric constant of said coating material is in the range of 2-5; and
   a protective plate attached to said sensing chip by means of said adhesive.

2. The fingerprint sensing device according to claim 1, wherein said coating material comprises one cavity for each sensing element.

3. The fingerprint sensing device according to claim 1, wherein a dielectric constant of said adhesive is in the range of 5-100.

4. The fingerprint sensing device according to claim 1, wherein a ratio between said dielectric constant of said adhesive and said dielectric constant of said coating material is equal to or larger than 2:1.

5. The fingerprint sensing device according to claim 1, wherein said adhesive comprises filler particles having a dielectric constant higher than an average dielectric constant of said adhesive.

6. The fingerprint sensing device according to claim 5, wherein said filler particles comprises a ferroelectric material, such as barium titanate (BaTiO3).

7. The fingerprint sensing device according to claim 1, wherein each of said cavities comprises at least one lateral opening connecting said cavity to at least one adjacent cavity, enabling a flow of said adhesive between adjacent cavities when depositing said adhesive.

8. The fingerprint sensing device according to claim 1, wherein said coating material is a photoresist.

9. A method for manufacturing a fingerprint sensing device, said fingerprint sensing device comprising: a sensing chip comprising an array of sensing elements, said sensing elements being configured to be connected to readout circuitry for detecting a capacitive coupling between each of said sensing elements and a finger placed on a sensing surface of said sensing device; a coating material arranged in a layer on top of said array of sensing elements, said coating material comprising a plurality of cavities filled with an adhesive; wherein locations of said cavities correspond to locations of said sensing elements, such that a cross-section area of a cavity covers at least a portion of an area of a corresponding sensing element; and wherein a dielectric constant of said adhesive is higher than a dielectric constant of said coating material and a dielectric constant of said coating material is in the range of 2-5; and a protective plate attached to said sensing chip by means of said adhesive, said method comprising;
   providing said sensing chip;
   depositing said layer of said coating material covering said array of conductive sensing elements;
   forming said plurality of cavities in said coating material;
   providing said adhesives to fill said cavities; and
   attaching said protective plate to said sensing device by means of said adhesive.

10. The method according to claim 9, wherein said coating layer is deposited by spin coating or by spray coating.

11. The method according to claim 9, further comprising plasma cleaning of said coating material prior to the step of providing said adhesive.

12. The method according to claim 9, wherein providing said adhesive comprises dispensing a liquid adhesive on said layer of coating material and in said cavities.

13. The method according to claim 9, wherein said coating material is a photoresist, and wherein forming a plurality of cavities in said coating material comprises patterning said layer of coating material by photolithography.

14. A fingerprint sensing device comprising:
   a sensing chip comprising an array of sensing elements, said sensing elements being configured to be connected to readout circuitry for detecting a capacitive coupling between each of said sensing elements and a finger placed on a sensing surface of said sensing device;
   a coating material arranged in a layer on top of said array of sensing elements, said coating material comprising a plurality of trenches filled with an adhesive; wherein said trenches are aligned with areas between said sensing elements; and wherein a dielectric constant of said adhesive is lower than a dielectric constant of said coating material; and a protective plate attached to said sensing chip by means of said adhesive.

15. A method for manufacturing a fingerprint sensing device, said fingerprint sensing device comprising: a sensing chip comprising an array of sensing elements, said sensing elements being configured to be connected to readout circuitry for detecting a capacitive coupling between each of said sensing elements and a finger placed on a sensing surface of said sensing device; a coating material arranged in a layer on top of said array of sensing elements, said coating material comprising a plurality of trenches filled with an adhesive; wherein said trenches are aligned with areas between said sensing elements; and wherein a dielectric constant of said adhesive is lower than a dielectric constant of said coating material; and a protective plate attached to said sensing chip by means of said adhesive, said method comprising;
   providing said sensing chip;
   depositing said layer of said coating material covering said array of sensing elements;
   forming said plurality of trenches in said coating material;
   providing said adhesive to fill said trenches; and
   attaching said protective plate to said sensing device by means of said adhesive.

16. A fingerprint sensing device comprising:
   a sensing chip comprising an array of sensing elements, said sensing elements being configured to be connected to readout circuitry for detecting a capacitive coupling between each of said sensing elements and a finger placed on a sensing surface of said sensing device;
   a coating material arranged in a layer on top of said array of sensing elements, said coating material comprising a plurality of cavities filled with an adhesive; wherein locations of said cavities correspond to locations of said sensing elements, such that a cross-section area of a cavity covers at least a portion of an area of a corresponding sensing element; and wherein a dielectric constant of said adhesive is higher than a dielectric constant of said coating material and a ratio between said dielectric constant of said adhesive and said dielectric constant of said coating material is equal to or larger than 2:1; and
   a protective plate attached to said sensing chip by means of said adhesive.

17. The fingerprint sensing device according to claim 16, wherein said coating material comprises one cavity for each sensing element.

18. The fingerprint sensing device according to claim 16, wherein a dielectric constant of said adhesive is in the range of 5-100.

19. The fingerprint sensing device according claim 16, wherein a dielectric constant of said coating material is in the range of 2-5.

20. The fingerprint sensing device according to claim 16, wherein said adhesive comprises filler particles having a dielectric constant higher than an average dielectric constant of said adhesive.

21. The fingerprint sensing device according to claim 20, wherein said filler particles comprises a ferroelectric material, such as barium titanate (BaTiO3).

22. The fingerprint sensing device according to claim 16, wherein each of said cavities comprises at least one lateral opening connecting said cavity to at least one adjacent cavity, enabling a flow of said adhesive between adjacent cavities when depositing said adhesive.

23. The fingerprint sensing device according to claim 16, wherein said coating material is a photoresist.

24. A method for manufacturing a fingerprint sensing device, said fingerprint sensing device comprising: a sensing chip comprising an array of sensing elements, said sensing elements being configured to be connected to readout circuitry for detecting a capacitive coupling between each of said sensing elements and a finger placed on a sensing surface of said sensing device; a coating material arranged in a layer on top of said array of sensing elements, said coating material comprising a plurality of cavities filled with an adhesive; wherein locations of said cavities correspond to locations of said sensing elements, such that a cross-section area of a cavity covers at least a portion of an area of a corresponding sensing element; and wherein a dielectric constant of said adhesive is higher than a dielectric constant of said coating material and a ratio between said dielectric constant of said adhesive and said dielectric constant of said coating material is equal to or larger than 2:1; and a protective plate attached to said sensing chip by means of said adhesive, said method comprising;
   providing said sensing chip;
   depositing said layer of said coating material covering said array of conductive sensing elements;
   forming said plurality of cavities in said coating material;
   providing an said adhesive to fill said cavities; and
   attaching said protective plate to said sensing device by means of said adhesive.

25. The method according to claim 24, wherein said coating layer is deposited by spin coating or by spray coating.

26. The method according to claim 24, further comprising plasma cleaning of said coating material prior to the step of providing said adhesive.

27. The method according to claim 24, wherein providing said adhesive comprises dispensing a liquid adhesive on said layer of coating material and in said cavities.

28. The method according to claim 24, wherein said coating material is a photoresist, and wherein forming a plurality of cavities in said coating material comprises patterning said layer of coating material by photolithography.

* * * * *